(12) United States Patent
Ito

(10) Patent No.: US 7,186,938 B2
(45) Date of Patent: Mar. 6, 2007

(54) MEMBRANE SWITCH, METHOD FOR MANUFACTURING MEMBRANE SWITCH, AND CONTACT SWITCH

(75) Inventor: Nobuhiro Ito, Kawagoe (JP)

(73) Assignee: Polymatech Co., Ltd., Tokyo (JP)

( * ) Notice: Subject to any disclaimer, the term of this patent is extended or adjusted under 35 U.S.C. 154(b) by 0 days.

(21) Appl. No.: 11/207,106

(22) Filed: Aug. 18, 2005

(65) Prior Publication Data

US 2006/0042924 A1    Mar. 2, 2006

(30) Foreign Application Priority Data

Aug. 25, 2004   (JP) ............................. 2004-245770

(51) Int. Cl.
*H01H 1/10* (2006.01)
(52) U.S. Cl. ........................................ 200/512; 29/622
(58) Field of Classification Search ................ 200/5 A, 200/511–517; 29/622
See application file for complete search history.

(56) References Cited

U.S. PATENT DOCUMENTS

| | | | | |
|---|---|---|---|---|
| 5,512,721 A | * | 4/1996 | Young et al. ................ 200/512 |
| 5,514,842 A | * | 5/1996 | Sugii et al. .................. 200/5 A |
| 6,479,775 B2 | * | 11/2002 | Shigetaka et al. ........... 200/517 |
| 6,483,055 B1 | * | 11/2002 | Tanabe et al. ............. 200/85 A |
| 6,906,273 B2 | * | 6/2005 | Searle et al. ................. 200/511 |
| 6,936,775 B2 | * | 8/2005 | Jiang et al. .................. 200/292 |
| 6,982,394 B2 | * | 1/2006 | Ide et al. ..................... 200/516 |

FOREIGN PATENT DOCUMENTS

JP    2003-45262    2/2003

* cited by examiner

*Primary Examiner*—Michael A Friedhofer
(74) *Attorney, Agent, or Firm*—Fish & Richardson P.C.

(57) ABSTRACT

A pressure detection switch includes a membrane switch and a key pad arranged on the membrane switch. The membrane switch includes first and second insulation sheets arranged to face each other. An electric circuit, which includes a first electrode and a voltage-dividing resistor, and a resist film, which protects the electric circuit, are formed on the lower surface of the first insulation sheet and above the second insulation sheet. The resist film has an opening through which the voltage-dividing resistor is exposed from the lower surface of the first insulation sheet.

15 Claims, 4 Drawing Sheets

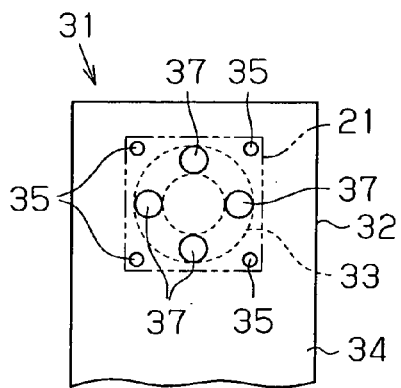
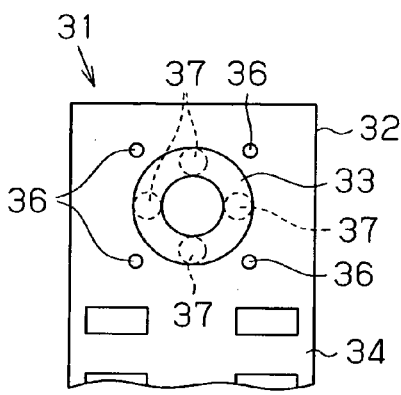
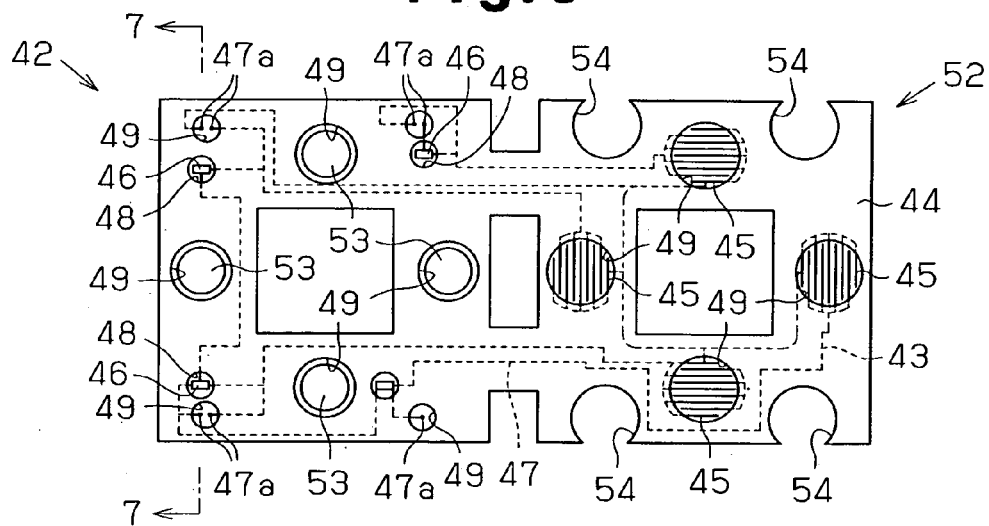
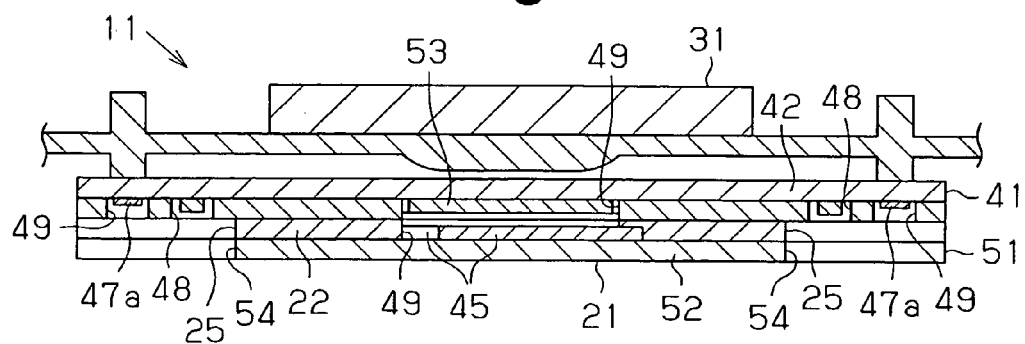

MEMBRANE SWITCH, METHOD FOR MANUFACTURING MEMBRANE SWITCH, AND CONTACT SWITCH

BACKGROUND OF THE INVENTION

The present invention relates to a membrane switch used to perform an input operation in electronics devices, such as remote controllers, keyboards, cellular telephones, personal digital assistants (PDAs), and digital still cameras (DSCs), a method for manufacturing a membrane switch, and a contact switch including a membrane switch.

Membrane switches, which are used to perform an input operation in electronics devices, are known in the prior art. Japanese Laid-Open Patent Publication No. 2003-45262 describes a membrane switch. This membrane switch includes first and second substrates, which are arranged to face each other. Two electrodes are arranged on the first and second substrates in a manner that the electrodes face each other. An electric circuit including a resistive element is formed on the first substrate. The resistive element is made from a conductive material. A resist film is further applied to the first substrate to protect the electric circuit from moisture. The resist film has an opening that exposes the electrodes and end portions of wires in the electric circuit from the surface of the first substrate. The wire end portions are connected to a power supply circuit through the opening.

The resistive element is formed by applying the conductive material and drying the applied conductive material. Further, the resistive element is covered by the resist film. The degree of dryness of the conductive material forming the resistive element differs depending on the degree to which a resist material is dried to form the resist film. Thus, the resistance of the resistive element easily changes depending on the degree of dryness of the resist material. As a result, when using membrane switches in the prior art, the resistance of resistance elements differs greatly between products and between resistors in the same product.

SUMMARY OF THE INVENTION

It is an object of the present invention to provide a membrane switch, a method for manufacturing a membrane switch, and a contact switch including the membrane switch that easily stabilizes the resistance of resistive elements.

One aspect of the present invention is a membrane switch including a first substrate and a second substrate arranged to face each other. Two electrodes are respectively arranged on the first and second substrates in a manner that the electrodes face each other. At least one of the electrodes is movable between a position at which the one of the electrodes comes in contact with the other one of the electrodes and a position at which the at least one of the electrodes is spaced from the other one of the electrodes. An electric circuit is arranged on the first substrate. A resist film is arranged on the first substrate to protect the electric circuit. The electric circuit includes a resistive element and is formed by applying and drying conductive material. The resist film has an opening through which the resistive element is exposed and is formed by applying and drying a resist material.

Another aspect of the present invention is a contact switch including a switch body formed by a membrane switch and a key pad arranged on the switch body. The membrane switch includes a first substrate and a second substrate arranged to face each other. Two electrodes are respectively arranged on the first and second substrates in a manner that the electrodes face each other. At least one of the electrodes is movable between a position at which the one of the electrodes comes in contact with the other one of the electrodes and a position at which the at least one of the electrodes is spaced from the other one of the electrodes. The two electrodes come in contact with each other when pressure is applied to the key pad toward the switch body. The two electrodes are spaced from each other when pressure is not applied to the key pad. An electric circuit is arranged on the first substrate. A resist film is arranged on the first substrate to protect the electric circuit. The electric circuit includes a resistive element and is formed by applying and drying conductive material. The resist film has an opening through which the resistive element is exposed and is formed by applying and drying a resist material.

A further aspect of the present invention is a method for manufacturing a membrane switch including a first substrate and a second substrate arranged to face each other. Two electrodes are respectively arranged on the first and second substrates in a manner that the electrodes face each other. At least one of the electrodes is movable between a position at which the one of the electrodes comes in contact with the other one of the electrodes and a position at which the at least one of the electrodes is spaced from the other one of the electrodes. The method includes applying and drying a conductive material on the first substrate to form an electric circuit having a plurality of resistive elements on the first substrate by applying the conductive material in the same direction to form each resistive element, and applying and drying a resist material on the first substrate to form a resist film for protecting the electric circuit on the first substrate and to form in the resist film an opening through which each resistive element is exposed.

Other aspects and advantages of the present invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which:

FIG. 5A is a bottom view showing a key pad;

FIG. 5B is a plan view showing the key pad;

FIG. 6 is a plan view showing a first insulation sheet and a second insulation sheet included in a pressure detection switch according to a further embodiment of the present invention;

FIG. 7 is an enlarged cross-sectional view showing the pressure detection switch taken along line 7—7 in FIG. 6;

DETAILED DESCRIPTION OF THE PREFERRED EMBODIMENTS

Figure 2:
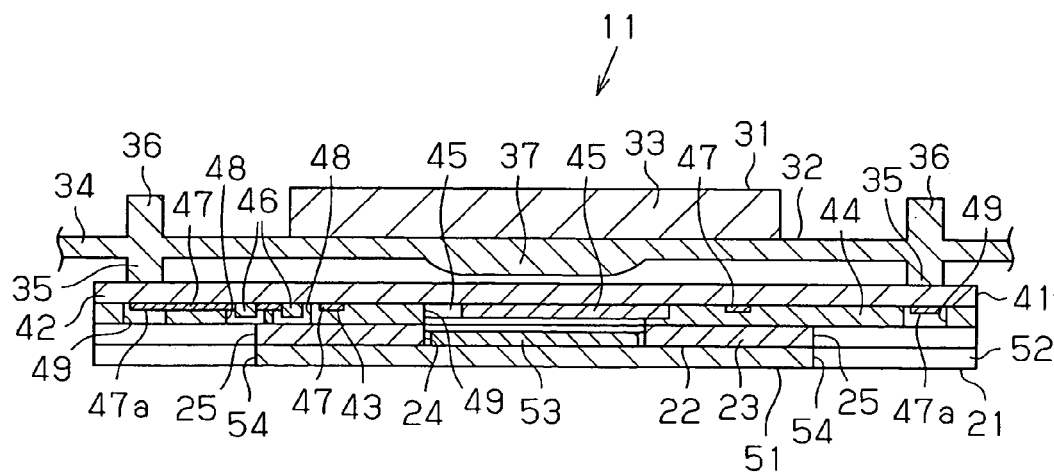
FIG. 2 is an enlarged cross-sectional view showing the pressure detection switch taken along line 2—2 in FIG. 1A.
Figure 3:
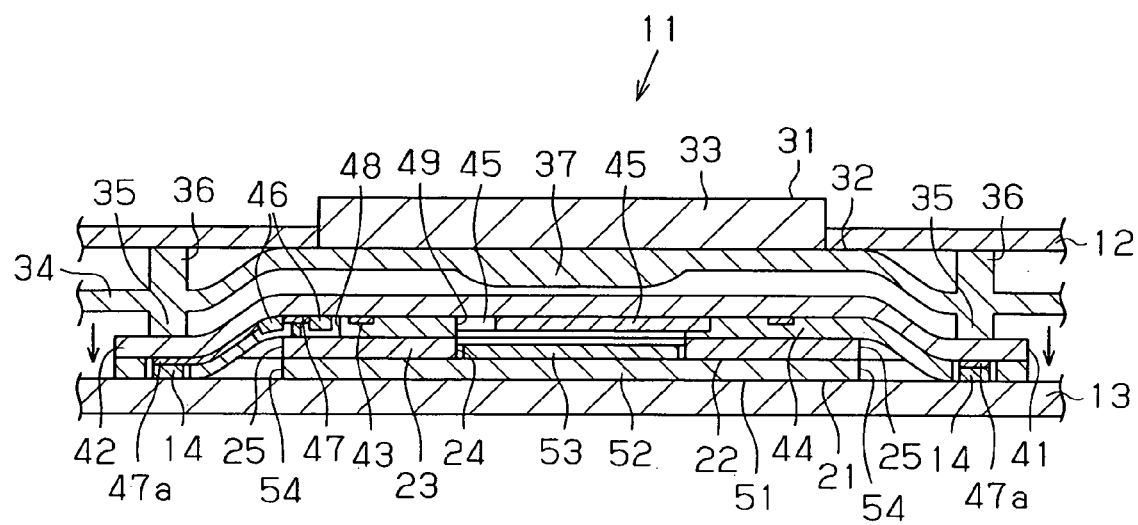
FIG. 3 is a cross-sectional view showing a state in which the pressure detection switch is arranged on a circuit board.

A pressure detection switch according to a preferred embodiment of the present invention will now be described with reference to the drawings. As shown in FIGS. 2 and 3, a pressure detection switch 11, which functions as a contact switch, includes a membrane switch 21 and a key pad 31. The membrane switch 21 forms a switch body. The key pad 31 is arranged on the membrane switch 21. The pressure detection switch 11 is arranged between a case 12 of a cellular telephone and a circuit board 13, which is arranged in the case 12. The pressure detection switch 11 is used to perform an input operation for the cellular telephone.

The membrane switch 21 includes two pressure detection sheets 41 and 51 and a spacer 22. The pressure detection sheets 41 and 51 are arranged to face each other in the vertical direction as viewed in FIGS. 2 and 3. The spacer 22 is interposed between the pressure detection sheets 41 and 51. Hereafter, the upper pressure detection sheet (facing towards the case 12) is referred to as the first pressure detection sheet 41, and the lower pressure detection sheet (facing towards the circuit board 13) is referred to as the second pressure detection sheet 51.

Figure 1A:
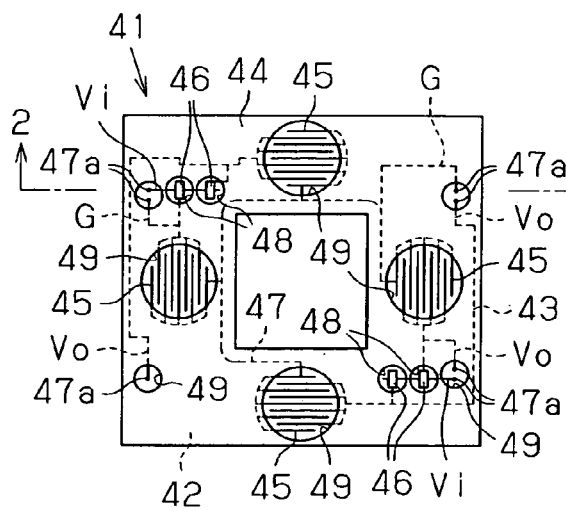
FIG. 1A is a bottom view showing a first pressure detection sheet included in a pressure detection switch according to a preferred embodiment of the present invention.

As shown in FIGS. 1A and 2, the first pressure detection sheet 41 includes a first insulation sheet 42 that functions as a first substrate, an electric circuit 43, and a resist film 44. The first insulation sheet 42 is a square frame-shaped sheet and is formed from a material that is electrically insulative and flexible. More specifically, the first insulation sheet 42 is formed by a synthetic resin film (e.g., a PET (polyethylene terephthalate) film) or by a sheet of a molded product made of elastomer.

The electric circuit 43 is arranged on a lower surface of the first insulation sheet 42. The electric circuit 43 includes four first electrodes 45, four voltage-dividing resistors 46, which function as resistive elements, and wirings 47 connecting the first electrodes 45 and the voltage-dividing resistors 46. Each of the first electrodes 45 has comb-shaped teeth. The first electrodes 45 are arranged around the opening formed in the middle of the first insulation sheet 42. Each first electrode 45 has a thickness of, for example, 3 to 8 μm. Each voltage-dividing resistor 46 is connected to a corresponding one of the first electrodes 45. Each voltage-dividing resistor 46 is rectangular. The voltage-dividing resistors 46 are arranged in parallel with one another so that their long sides extend in one direction. In other words, the voltage-dividing resistors 46 are all arranged to extend in the same direction. This arrangement enables the voltage-dividing resistors 46 to be formed more easily by performing screen printing with a squeegee so that they have the same thickness as compared with when voltage-dividing resistors are arranged to extend in different directions. As a result, the difference between the resistances of the voltage-dividing resistors 46 is reduced.

Figure 4A:
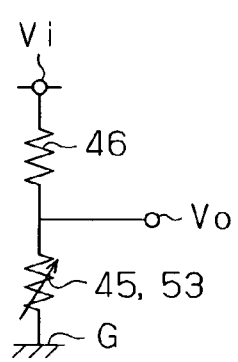
FIG. 4A is a circuit diagram showing an equivalent circuit including a first electrode and a voltage-dividing resistor.
Figure 4B:
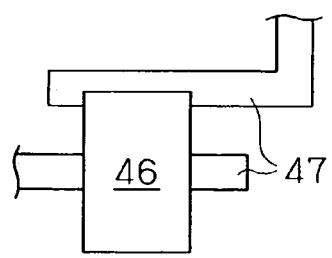
FIG. 4B is a partially enlarged plan view showing the voltage-dividing resistor.

Each wiring 47, which connects a set of the first electrode 45 and the voltage-dividing resistor 46, includes a ground line G, an output line Vo, and a power supply line Vi. Each set of the first electrode 45 and the voltage-dividing resistor 46 configures an equivalent circuit as shown in FIG. 4A. For example, one or more electrodes 45 may be connected to the ground line G. An end portion 47a of each wiring 47 is located in a corner of the lower surface of the first insulation sheet 42.

The electric circuit 43 is formed by screen-printing a circuit pattern using a conductive material, such as a conductive ink. The screen-printing is performed by applying the conductive material and drying the applied conductive material. The conductive material used to form the first electrodes 45 and the wirings 47 differs from conductive material used to form the voltage-dividing resistors 46. More specifically, the conductive material used to form the first electrodes 45 and the wirings 47 is a material containing metal powder (e.g., metal foil and silver filler) or a material containing above metal powder and carbon powder. Such a material for the first electrodes 45 and the wirings 47 has low resistance. The conductive material used to form the voltage-dividing resistors 46 is an organic matrix in liquid form containing carbon powder or metal powder. Such a material for the voltage-dividing resistors 46 has high resistance. It is preferable that the material for the voltage-dividing resistors 46 be conductive material containing carbon powder since it easily stabilizes the resistance of each voltage-dividing resistor 46.

The resist film 44 is applied to the lower surface of the first insulation sheet 42 to protect the electric circuit 43 from moisture. The resist film 44 is formed by applying a resist material to the first insulation sheet 42 and drying the applied resist material. Specific examples of the resist material include solvents in which polyester, vinyl chloride, and acrylic urethane resin materials are dissolved. The resist film 44 has circular openings 48 at locations corresponding to each voltage-dividing resistor 46. The openings 48 expose each voltage-dividing resistor 46 from the lower surface of the first insulation sheet 42. The resist film 44 further has circular second openings 49 at locations corresponding to each first electrode 45 and the end portion 47a of each wiring 47. The second openings 49 expose each first electrode 45 and the end portion 47a of each wiring 47 from the lower surface of the first insulation sheet 42.

Figure 1B:
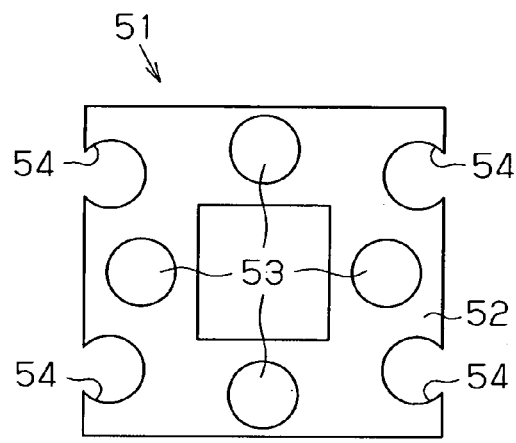
FIG. 1B is a plan view showing a second pressure detection sheet included in the pressure detection switch.

As shown in FIGS. 1B and 3, the second pressure detection sheet 51 includes a second insulation sheet 52, which functions as a second substrate, and second electrodes 53. The second insulation sheet 52 is a square frame-shaped sheet. The second insulation sheet 52 may be formed from a material that is electrically insulative and flexible in the same manner as the first insulation sheet 42 or may be formed from a material that is only electrically insulative. The second insulation sheet 52 has a first cutaway portion 54, which functions as a third opening that is substantially circular, located at positions corresponding to each corner of the first insulation sheet 42.

The second electrodes 53 are arranged on the upper surface of the second insulation sheet 52. Each second electrode 53 is disk-shaped and arranged to face a corresponding one of the first electrodes 45. The second electrodes 53 are formed by performing screen printing using a conductive material. It is preferable that the second electrodes 53 be formed from the same type of material as the material for the voltage-dividing resistors 46. When the second electrodes 53 are formed from the same type of material as the material for the voltage-dividing resistors 46, the content of carbon powder or metal powder in the conductive material for the second electrodes 53 is easily equalized with the content of carbon powder or metal powder in the conductive material for the voltage-dividing resistors 46. Thus, the ratio at which the second electrodes 53 and the voltage-dividing resistors 46 divide the power supply voltage is always the same in every product. This reduces differences in the pressure detection characteristic of the membrane switch 21 between products compared to when the second electrodes 53 and the voltage-dividing resistors 46 are formed from different conductive materials. The second electrode 53 has a thickness of, for example, 3 to 8 μm.

The spacer 22 is formed by an adhesive supported on a rectangular frame-shaped supporting member 23. Specific examples of the supporting member 23 include paper, non-woven cloth, and synthetic resin film such as a PET film. The supporting member 23 has a thickness of, for example, 75 μm. Specific examples of the adhesive include pressure detection adhesives, such as acrylic, urethane, silicone, polyisobutylene-butyl rubber, block copolymer, natural rubber, and polyisoprene adhesives.

As shown in FIG. 2, the supporting member 23 has a circular through-hole 24 at locations corresponding to the first and second electrodes 45 and 53. The through-hole 24 has, for example, a diameter larger than the diameter of the second electrode 53. The supporting member 23 further has a second cutaway portion 25, which is substantially circular, at locations corresponding to each corner of the first insulation sheet 42. The second cutaway portion 25 has the same shape as the first cutaway portion 54. The thickness of the supporting member 23 enables the spacer 22 to space the first electrodes 45 from the second electrodes 53 when the pressure detection switch 11 is not in use.

The key pad 31 includes a pad 32 and a key top 33. The key top 33 is arranged on the pad 32. The pad 32 includes a main pad portion 34, first projections 35, second projections 36, and pressing portions 37. The main pad portion 34 is a flexible sheet formed from a thermoplastic elastomer, a synthetic rubber, or a soft resin material. Specific examples of the synthetic rubber include silicone rubber. Specific examples of the thermoplastic elastomer include styrene, olefin, polyester, and urethane thermoplastic elastomers. Specific examples of the soft resin material include vinyl chloride, soft acrylic, and soft polycarbonate resin materials. Among these materials, it is preferable that silicone rubber be used as the material for the main pad portion 34 since silicone rubber has a superior molding characteristic, compression permanent strain that is small, and is little affected by temperatures.

As shown in FIGS. 2, 5A, and 5B, each first projection 35 is arranged on the lower surface of the main pad portion 34 at a location corresponding to a corner of the first insulation sheet 42. The first projection 35 is cylindrical and has a distal end surface bonded to the upper surface of the first insulation sheet 42. It is preferable that the first projection 35 be formed from an elastic material such as a synthetic rubber. The height of each first projection 35 forms a gap between the first insulation sheet 42 and the main pad portion 34.

Each second projection 36 is cylindrical and is arranged on the upper surface of the main pad portion 34 at a location corresponding to one of the first projections 35. Each pressing portion 37 projects toward a corresponding one of the first electrodes 45 from the lower surface of the main pad portion 34. Each pressing portion 37 may be in contact with or spaced from the upper surface of the first insulation sheet 42. In the preferred embodiment, the pressing portion 37 is spaced from the upper surface of the first insulation sheet 42. It is preferable that the pressing portion 37 have a hardness of 30 or more to prevent its hysteresis from affecting the pressure sensing characteristic of the membrane switch 21. The hardness of the pressing portion 37 is determined in accordance with ISO 7619, which corresponds to JIS K 6253.

The first and second projections 35 and 36 and the pressing portions 37 may be formed integrally with the main pad portion 34 or separately from the main pad portion 34. In the preferred embodiment, the first and second projections 35 and 36 and the pressing portions 37 are formed integrally with the main pad portion 34.

As shown in FIGS. 2 and 5B, the key top 33 is annular and extends along each pressing portion 37. The bottom surface of the key top 33 is adhered to the upper surface of the main pad portion 34. The key top 33 may be formed from the same type of material as the material for the main pad portion 34. However, it is preferable that the key top 33 be formed from a hard resin material to ensure that input operations are performed with high reliably. Specific examples of the hard resin material include a polycarbonate resin, an ABS (acrylonitrile-butadiene-styrene) resin, a styrene resin, an epoxy resin, and an acrylic resin. When the key top 33 is formed from the same type of material as the material for the main pad portion 34, the key top 33 may be formed integrally with the main pad portion 34 or may be formed separately from the main pad portion 34.

As shown in FIG. 3, the circuit board 13 has contacts 14 on its upper surface at locations corresponding to the end portions 47a of each wiring 47. The case 12 has an opening in which the key top 33 is accommodated.

A method for manufacturing the pressure detection switch 11 will now be described. The pressure detection switch 11 is manufactured after performing a process for manufacturing the membrane switch 21, a process for manufacturing the key pad 31, and a process for arranging the key pad 31 on the membrane switch 21.

The manufacturing of the membrane switch 21 includes a first process, in which the first and second pressure detection sheets 41 and 51 and the spacer 22 are formed, and a second process, in which the spacer 22 is arranged between the first and second pressure detection sheets 41 and 51.

In the first process, the formation of the first pressure detection sheet 41 includes a first step, in which the first insulation sheet 42 and the electric circuit 43 are formed, and a second step, in which the resist film 44 is formed on the first insulation sheet 42. In the first step, the first insulation sheet 42 is injection molded from, for example, a synthetic resin material. Next, a circuit pattern corresponding to the first electrodes 45 and the wirings 47 is printed on the lower surface of the first insulation sheet 42 with a conductive material using a squeegee and a screen printing plate. Then, a circuit pattern corresponding to the voltage-dividing resistors 46 is printed on the lower surface of the first insulation sheet 42 with a conductive material to form the electric circuit 43. It is preferable that the direction in which the conductive material for the voltage-dividing resistors 46 is printed, that is, the direction in which the conductive material is applied using the squeegee, be the same for all the voltage-dividing resistors 46 to reduce differences in the resistances of the voltage-dividing resistors 46.

The printing direction of the conductive material for each voltage-dividing resistor 46 may be perpendicular to or parallel with the corresponding wiring 47. When the direction in which the conductive material is applied is parallel with the wiring 47, the thickness of the applied conductive material is the same at locations close to the wiring 47 and locations distant from the wiring 47. This enables the resistance of the voltage-dividing resistor 46 to be stabilized in a simple and ensured manner. In the second step, a resist material is printed on the lower surface of the first insulation sheet 42 using a printing plate having openings corresponding to parts other than the openings 48 and 49. This forms the resist film 44.

When forming the second pressure detection sheet 51 in the first process, the second insulation sheet 52 is injection molded from, for example, a synthetic resin material. Next, the second electrodes 53 are printed on the upper surface of the second insulation sheet 52 with a conductive material. It is preferable that printing of a circuit pattern including the voltage-dividing resistors 46 on the first insulation sheet 42 and printing of the second electrodes 53 be performed using the same screen printing plate. This screen printing plate has openings corresponding to the circuit pattern including the voltage-dividing resistors 46 and the second electrodes 53.

In this state, the second electrodes 53 are printed using the same screen printing plate as the screen printing plate used when the voltage-dividing resistors 46 are formed. In this case, each second electrode 53 is formed to have the same thickness as the thickness of each voltage-dividing resistor 46. This prevents the ratio at which the second electrodes 53 and the voltage-dividing resistors 46 divide the power supply voltage from differing between product, while always maintaining the same ratio at which the second electrodes 53 and the voltage-dividing resistors 46 divide the power supply voltage. This reduces differences between products in the pressure sensing characteristic of the membrane switch 21 as compared with when the second electrodes 53 and the voltage-dividing resistors 46 are printed using different screen printing plates. When forming the spacer 22 in the first process, an adhesive is supported on the supporting member 23, which has a predetermined shape, to form the spacer 22.

In the second process, after the spacer 22 is arranged between the first and second pressure detection sheets 41 and 51, the first pressure detection sheet 41 and the second pressure detection sheet 51 are adhered to the upper and lower surfaces of the spacer 22. The end portion 47a of each wiring 47 is exposed from the lower surface of the first insulation sheet 42 through the first and second cutaway portions 54 and 25.

To manufacture the key pad 31, the pad 32 and the key top 33 are injection molded from, for example, a synthetic resin material. Then, the bottom surface of the key top 33 is adhered to the upper surface of the main pad portion 34. To mount the key pad 31 on the membrane switch 21, the distal end surface of each first projection 35 on the key pad 31 is adhered to the corresponding corner of the upper surface of the first insulation sheet 42.

The method for attaching the pressure detection switch 11 to the case 12 of the cellular telephone will now be described. Referring to FIG. 3, to attach the pressure detection switch 11 to the case 12, the pressure detection switch 11 is first arranged on the circuit board 13 so that the pressure detection switch 11 is arranged between the case 12 and the circuit board 13. In this state, the upper surface of the main pad portion 34 is in contact with the inner surface of the case 12. Further, each second projection 36 is pressed against the circuit board 13 by the case 12 so that the main pad portion 34 is elastically deformed toward the circuit board 13 in the vicinity of each second projection 36. Thus, as the main pad portion 34 deforms, the first projections 35 press the corners of the first insulation sheet 42 toward the circuit board 13 as indicated by the arrows shown in FIG. 3. As a result, the corners of the first insulation sheet 42 move toward the circuit board 13 due to the second cutaway portions 25 of the spacer 22 and the first cutaway portions 54 of the second insulation sheet 52 so as to come in contact with the upper surface of the circuit board 13. The end portions 47a of the wirings 47 come in contact with the contacts 14 of the circuit board 13 so that the electric circuit 43 of the pressure detection switch 11 and an electric circuit of the circuit board 13 are electrically connected to each other.

The operation of the pressure detection switch 11 will now be described. To perform a predetermined input operation using the cellular telephone, a predetermined position of the key top 33 is pushed down. When the key top 33 is pushed down, the pressing portion 37 moves the first electrode 45 from the position at which the first electrode 45 is spaced from the second electrode 53 to the position at which the first electrode 45 comes in contact with the second electrode 53. As a result, the first electrode 45 comes in contact with the second electrode 53 so that the first electrode 45 and the second electrode 53 are electrically connected to each other. In this state, the area of contact between the first electrode 45 and the second electrode 53 changes in accordance with the downward pushing pressure applied to the key top 33. The equivalent circuit shown in FIG. 4A detects the applied pressure. Afterwards, when the pressure applied to the key top 33 is removed, the elastic force of the first insulation sheet 42 causes the first electrode 45 to move from the position at which the first electrode 45 comes in contact with the second electrode 53 to the position at which the first electrode 45 is spaced from the second electrode 53. As a result, the first electrode 45 is spaced from the second electrode 53 to electrically disconnect the first and second electrodes 45 and 53.

The preferred embodiment has the advantages described below.

The voltage-dividing resistors 46 in the preferred embodiment are exposed from the lower surface of the first insulation sheet 42 through the openings 48 of the resist film 44. This prevents the resistances of the voltage-dividing resistors 46 from changing in accordance with the degree of dryness of the resist material. Thus, the resistances of the voltage-dividing resistors 46 included in the membrane switch 21 are easily stabilized. As a result, differences between products in the resistances of the voltage-dividing resistors 46 of the membrane switch 21 are reduced. Further, differences in the resistances of the four voltage-dividing resistors 46 arranged on the first insulation sheet 42 are also reduced.

The pressure detection switch 11 of the preferred embodiment is arranged on the circuit board 13. The end portions 47a of the wirings 47 are pressed against the circuit board 13 by the first projections 35 so as to come in contact with the contacts 14 of the circuit board 13. The pressure detection switch 11 is electrically connected to the electric circuit of the circuit board 13 without requiring the end portions 47a of the wirings 47 to be electrically connected to the contacts 14 of the circuit board 13 using connectors or the like or without requiring the end portions 47a of the wirings 47 to be soldered to the contacts 14 of the circuit board 13. The pressure detection switch 11, which does not require connectors or the like to be used, enables the cellular telephone to be thinner. The pressure detection switch 11, which does not require soldering, facilitates the manufacturing of the cellular telephone.

It is preferable that the first projections 35 in the preferred embodiment be formed from an elastic material. When the first projections 35 are formed from an elastic material, the elastic force of the first projections 35 enable the corners of the first insulation sheet 42 to be pressed strongly against the circuit board 13. Thus, the end portions 47a of the wirings 47 strongly come in contact with the contacts 14 of the circuit board 13. This prevents misalignment of the end portions 47a of the wirings 47.

It should be apparent to those skilled in the art that the present invention may be embodied in many other specific forms without departing from the spirit or scope of the invention. Particularly, it should be understood that the present invention may be embodied in the following forms.

The first and second insulation sheets 42 and 52 may be formed using one insulation sheet. In this case, the insulation sheet is foldable at its middle portion. As shown in FIG. 6, the voltage-dividing resistors 46 and the end portions 47a of the wirings 47 may be arranged on the inner surface of the first insulation sheet 42, and the first electrodes 45 may be arranged on the inner surface of the second insulation sheet 52. The second electrodes 53 are arranged on the inner surface of the first insulation sheet 42. The resist film 44 is arranged integrally on the inner surfaces of the first and second insulation sheets 42 and 52. The openings 48 are formed in the resist film 44. Further, the second openings 49 are formed in the resist film 44 at locations corresponding to the first and second electrodes 45 and 53 and the end portions 47a of the wirings 47. The insulation sheet shown in FIG. 6 is folded at its middle portion so that the second electrodes 53 face the corresponding first electrodes 45. In this structure, the first electrodes 45 are arranged below the second electrodes 53 as shown in FIG. 7.

Figure 8A:
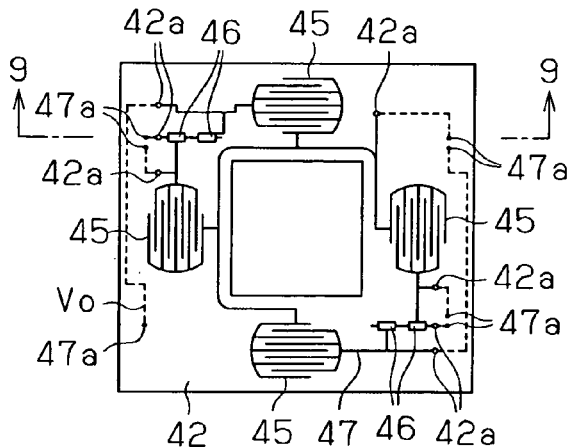
FIG. 8A is a plan view showing a first insulation sheet included in a pressure detection switch according to a further embodiment of the present invention.
Figure 8B:
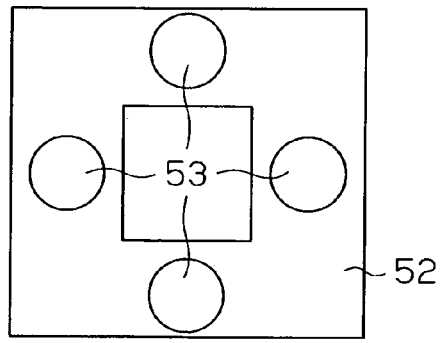
FIG. 8B is a bottom view showing a second insulation sheet included in a pressure detection switch according to a further embodiment of the present invention.
Figure 9:
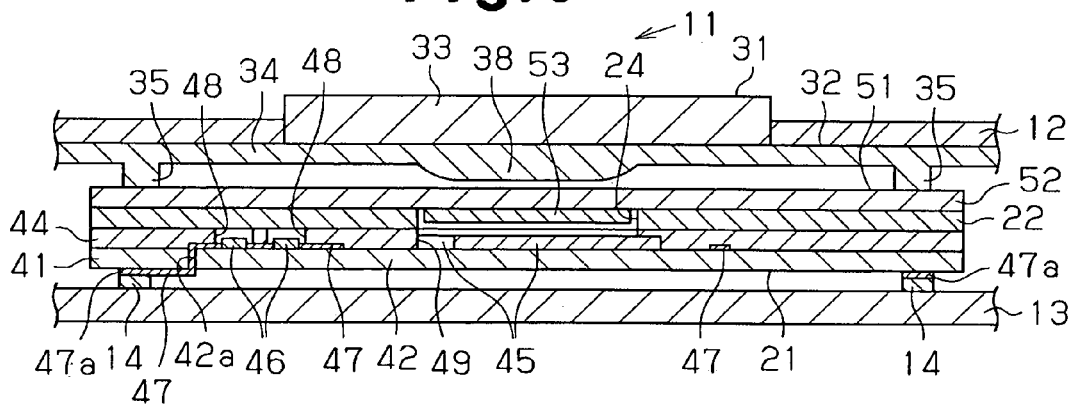
FIG. 9 is an enlarged cross-sectional view showing the pressure detection switch taken along line 9—9 in FIG. 8A.

As shown in FIGS. 8A, 8B, and 9, the first insulation sheet 42 may be arranged below the second insulation sheet 52. In this case, the electric circuit 43 is arranged on the upper surface of the first insulation sheet 42. The wirings 47 extending from the first electrodes 45 and the voltage-dividing resistors 46 extend to the lower surface of the first insulation sheet 42 facing the circuit board 13 via through-holes 42a, which are formed in the first insulation sheet 42. As a result, the end portions 47a of the wirings 47 are located at corners of the lower surface of the first insulation sheet 42. The second insulation sheet 52 is flexible and does not have the first cutaway portions. The spacer 22 does not have the second cutaway portions. In the pressure detection switch 11, which is arranged on the circuit board 13, the distance between the end portion 47a of each wiring 47 and the contact 14 of the circuit board 13 is less as compared with when the first insulation sheet 42 is arranged above the second insulation sheet 52. This enables the end portions 47a of the wirings 47 to easily and strongly come in contact with the contacts 14 of the circuit board 13. This further ensures prevention of misalignment of the end portions 47a of the wirings 47. Further, each corner of the first insulation sheet 42 does not need to be elastically deformed. The pressure applied by the first projection 35 to the first insulation sheet 42 is small as compared with when the first insulation sheet 42 is arranged above the second insulation sheet 52.

Figure 10A:
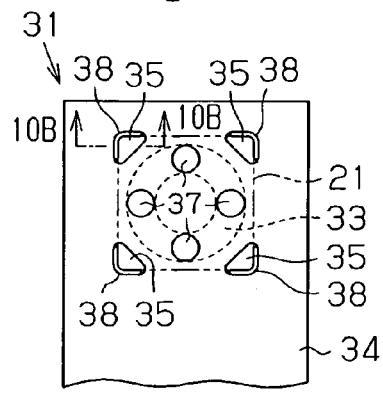
FIG. 10A is a bottom view showing a key pad according to a further embodiment of the present invention.
Figure 10B:
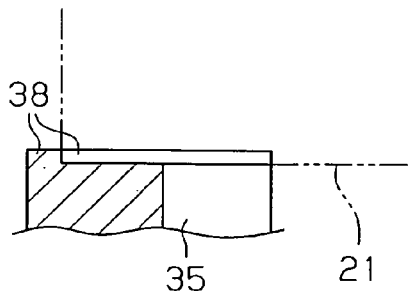
FIG. 10B is an enlarged cross-sectional view showing a first projection taken along line 10B—10B in FIG. 10A.

As shown in FIG. 10, each first projection 35 may be triangular. A third projection 38, which extends along the sides of each first projection 35, may be arranged on the top surface of each first projection 35. Each corner of the membrane switch 21 comes in contact with the inner side surface of the third projection 38. With this structure, the key pad 31 is easily positioned with the membrane switch 21 when the key pad 31 is mounted on the membrane switch 21. Alternatively, each of the first and second projections 35 and 36 may be box-shaped or each of the first and second projections 35 and 36 may be formed by an elastic member, such as a coil spring.

The pressure detection switch 11 or the membrane switch 21 in the preferred embodiment may be used to perform an input operation for an electronic device other than a cellular telephone. For example, the pressure detection switch 11 or the membrane switch 21 may be used to perform an input operation for a remote control, personal digital assistant (PDA), a portable gaming device, or media player.

The number of the first electrodes 45 may be changed. For example, one first electrode 45 may be provided, or five first electrodes 45 may be provided. It is only required that at least one first electrode 45 be arranged. In this case, the number of the voltage-dividing resistors 46 and the number of the second electrodes 53 are also changed in accordance with the number of the first electrodes 45.

The shape of each first electrode 45 may be changed. For example, each first electrode 45 may be formed in the shape of plural concentric circles or a line. In the same manner, each second electrode 53 may be formed as a triangular plate. The shape of the second electrode 53 corresponds to the shape of the first electrode 45. The shape of the first electrode 45 and the shape of the second electrode 53 are set so that the area of contact between the first electrode 45 and the second electrode 53 changes according to the downward pressure applied to the key top 33.

The first electrode 45 and the second electrode 53 may be formed so that the area of contact between the first electrode 45 and the second electrode 53 does not change in accordance with the downward pressure applied to the key top 33. In other words, the contact switch may be formed as a non-pressure detection switch.

The second projections 36 may be eliminated. In this case, projections corresponding to the first projections 35 are formed on the inner surface of the case 12.

The resist film 44 may be arranged on the upper surface of the second insulation sheet 52. In this case, an opening corresponding to each second electrode 53 is formed in the resist film 44.

The end portions 47a of the wirings 47 may be arranged at locations other than the corners of the lower surface of the first insulation sheet 42. In this case, the first and second cutaway portions 54 and 25 and the first and second projections 35 and 36 are arranged at positions corresponding to the end portions 47a of the wirings 47.

The electric circuit 43 or the second electrodes 53 may be formed through a printing method other than screen printing. For example, the electric circuit 43 or the second electrodes 53 may be printed with an inkjet printing machine. When performing screen printing, the thickness of each voltage-dividing resistor 46 and each second electrode 53 has a tendency of being uneven when the conductive material is applied in different directions or when different screen printing plates are used. When the electric circuit 43 and the second electrodes 53 are printed by an inkjet printing machine, conductive material, which is applied without using a printing plate, is always applied in a direction perpendicular to the first insulation sheet 42 or to the second insulation sheet 52. Thus, printing using an inkjet printing machine easily enables each voltage-dividing resistor 46 and each second electrode 53 to have an even thickness. Thus, printing using an inkjet printing machine easily reduces differences between the resistances of the voltage-dividing resistors 46 as compared with screen printing. Further, printing using an inkjet printing machine easily narrows each wiring 47. In this way, printing using an inkjet printing machine increases freedom in the arrangement of the voltage-dividing resistors 46 and the shape of the wirings 47 in the electric circuit 43.

The shapes of the first and second insulation sheets 42 and 52 and the supporting member 23 may be changed. For example, each of the first and second insulation sheets 42 and 52 and the supporting member 23 may be square or annular.

The main pad portion 34 and the key top 33 may be formed integrally. In the same manner, the main pad portion 34 and the first insulation sheet 42 may be formed integrally.

The shape of each voltage-dividing resistor 46 may be changed. For example, each voltage-dividing resistor 46 may be a regular square or circular.

Examples of the present invention and comparative examples will now be described.

In example 1, the four voltage-dividing resistors 46 of the membrane switch 21 of the preferred embodiment were formed using a conductive material containing carbon powder and designed to have a resistance of 3.3 kΩ. The printing direction of the conductive material for each voltage-dividing resistor 46 was perpendicular to the wiring 47 at locations where the voltage-dividing resistor 46 were arranged. The resistance of one of the four voltage-dividing resistors 46 was measured.

In example 2, the measurement of the resistance was conducted in the same manner as in example 1. However, each voltage-dividing resistor 46 was designed to have a resistance of 4.7 kΩ.

In comparative example 1, the measurement of the resistance was conducted in the same manner as in example 1. Each voltage-dividing resistor 46 was covered by the resist film 44. In comparative example 2, the measurement of the resistance was conducted in the same manner as in example 2. Each voltage-dividing resistor 46 was covered by the resist film 44. The drying time for the resist material was set at 30 minutes, 60 minutes, and 90 minutes in comparative examples 1 and 2. The resistance of the voltage-dividing resistor 46 was measured after each drying time had elapsed. The resistance increase ratio was calculated from the resistances measured in comparative examples 1 and 2 using expression 1, which is shown below. The measured resistance is shown under "measured value" and the calculated resistance increase ratio is shown under "increase ratio" in table 1.

$$\text{Resistance Increase Ratio [\%]} = \text{Measured value } [k\Omega] / \text{Designed Resistance } [k\Omega] * 100 \quad (1)$$

TABLE 1

|  | Drying time | Measured Value | Increase Ratio |
|---|---|---|---|
| Example 1 (Designed Resistance = 3.3 kΩ) | — | 2.3 kΩ | — |
| Comparative Example 1 (Designed Resistance = 3.3 kΩ) | 30 min. | 20.5 kΩ | 621.2% |
|  | 60 min. | 16.5 kΩ | 500.0% |
|  | 90 min. | 11.9 kΩ | 360.6% |
| Example 2 (Designed Resistance = 4.7 kΩ) | — | 4.0 kΩ | — |
| Comparative Example 2 (Designed Resistance = 4.7 kΩ) | 30 min. | 44.8 kΩ | 953.2% |
|  | 60 min. | 37.2 kΩ | 791.5% |
|  | 90 min. | 26.3 kΩ | 559.6% |

As shown in table 1, the resistances of the membrane switches 21 of examples 1 and 2 are closer to their designed resistances as compared with the membrane switches of comparative examples 1 and 2. For the membrane switches 21 of examples 1 and 2, the resistances measured in time intervals remain unchanged. For the membrane switches of comparative examples 1 and 2, the resistance increase ratio was higher as the drying time of the resist material was shortened. For the membrane switches of comparative examples 1 and 2, the resistances changed greatly in accordance with the drying time. These results indicate that the membrane switches 21 of examples 1 and 2 in which the voltage-dividing resistors 46 were not covered by the resist film 44 stabilize the resistances of the voltage-dividing resistors 46 at values close to their design resistances.

In example 3, the same membrane switch 21 as in example 1 was used. The resistances of three of the four voltage-dividing resistors 46 were measured. In example 4, the measurement of the resistances was conducted in the same manner as in example 3. The design resistance of each voltage-dividing resistor 46 was changed to 4.7 kΩ.

In comparative example 3, the measurement of the resistances was conducted in the same manner as in example 3. Each voltage-dividing resistor 46 was covered by the resist film 44. In comparative example 4, the measurement of the resistance was conducted in the same manner as in example 4. Each voltage-dividing resistor 46 was covered by the resist film 44. The drying time of the resist material was set at 90 minutes in comparative examples 3 and 4.

The average resistance was calculated from the resistances measured in examples 3 and 4 and comparative examples 3 and 4, and the resistance distribution was calculated using expression 2, which is shown below. The measured resistance is shown under "measured value", the calculated average value is shown under "average resistance", and the calculated distribution is shown under "distribution" in table 2. The distribution is an index indicating differences in the measured resistances. The difference in the measured resistances is greater as the value of the distribution increases.

$$\text{Distribution [\%]} = (\text{Maximum Value Among Measured Values } [k\Omega] - \text{Minimum Value Among Measured Values } [k\Omega]) / \text{Average Resistance } [k\Omega] * 100 \quad (2)$$

TABLE 2

|  | Measured Value | Average Resistance | Distribution |
|---|---|---|---|
| Example 3 (Designed Resistance = 3.3 kΩ) | 2.4 kΩ 2.4 kΩ 2.2 kΩ | 2.3 kΩ | 8.5% |
| Comparative Example 3 (Designed Resistance = 3.3 kΩ) | 13.0 kΩ 13.4 kΩ 9.2 kΩ | 11.9 kΩ | 35.4% |
| Example 4 (Designed Resistance = 4.7 kΩ) | 4.5 kΩ 4.2 kΩ 3.9 kΩ | 4.2 kΩ | 14.3% |
| Comparative Example 4 (Designed Resistance = 4.7 kΩ) | 30.0 kΩ 28.1 kΩ 20.6 kΩ | 26.3 kΩ | 35.8% |

As shown in table 2, the resistance distribution for the membrane switches 21 of examples 3 and 4 is lower than the resistance distribution calculated for the membrane switches of comparative examples 3 and 4. These results indicate that the membrane switches 21 of examples 3 and 4 in which the voltage-dividing resistors 46 are not covered by the resist film 44 reduce differences in the resistances of a plurality of voltage-dividing resistors 46 arranged on the first insulation sheet 42.

The present examples and embodiments are to be considered as illustrative and not restrictive, and the invention is not to be limited to the details given herein, but may be modified within the scope and equivalence of the appended claims.

What is claimed is:

1. A membrane switch comprising:
    a first substrate and a second substrate arranged to face each other;
    two electrodes respectively arranged on the first and second substrates in a manner that the electrodes face each other, with at least one of the electrodes being movable between a position at which the one of the electrodes comes in contact with the other one of the electrodes and a position at which the at least one of the electrodes is spaced from the other one of the electrodes;
    an electric circuit arranged on the first substrate; and
    a resist film, arranged on the first substrate, for protecting the electric circuit, wherein the electric circuit includes a resistive element and is formed by applying and drying conductive material, and the resist film has an opening through which the resistive element is exposed and is formed by applying and drying a resist material.

2. The membrane switch according to claim 1, wherein the resistive element is formed from a conductive material containing carbon powder.

3. The membrane switch according to claim 1, wherein the electrode arranged on the second substrate and the resistive element are formed from the same type of conductive material.

4. The membrane switch according to claim 1, wherein the electrode arranged on the first substrate includes comb-shaped teeth.

5. A contact switch comprising:
    a switch body formed by a membrane switch; and
    a key pad arranged on the switch body, wherein the membrane switch includes:
        a first substrate and a second substrate arranged to face each other;
        two electrodes respectively arranged on the first and second substrates in a manner that the electrodes face each other, wherein at least one of the electrodes is movable between a position at which the one of the electrodes comes in contact with the other one of the electrodes and a position at which the at least one of the electrodes is spaced from the other one of the electrodes, the two electrodes coming in contact with each other when pressure is applied to the key pad toward the switch body, and the two electrodes being spaced from each other when pressure is not applied to the key pad;
        an electric circuit arranged on the first substrate; and
        a resist film, arranged on the first substrate, for protecting the electric circuit, wherein the electric circuit includes a resistive element and is formed by applying and drying conductive material, and the resist film has an opening through which the resistive element is exposed and is formed by applying and drying a resist material.

6. The contact switch according to claim 5, wherein:
    the contact switch is arranged on a circuit board;
    the electric circuit includes wiring for connecting the electrode of the first substrate and the resistive element, the wiring having an end portion formed on the first substrate on a surface facing the second substrate;
    the resist film has a second opening through which the end portion of the wiring is exposed;
    the second substrate is arranged to face the circuit board, and the second substrate has a third opening corresponding to the end portion of the wiring; and
    the key pad includes a projection, corresponding to the end portion of the wiring, for pressing the first substrate toward the circuit board through the third opening.

7. The contact switch according claim 5, wherein:
    the contact switch is arranged on a circuit board;
    the first substrate is arranged to face the circuit board, and the first substrate includes a surface facing the circuit board;
    the electric circuit includes wiring for connecting the electrode of the first substrate and the resistive element, the wiring having an end portion formed on the surface of the first substrate facing the circuit board; and
    the key pad includes a projection, corresponding to the end portion of the wiring, for pressing the first substrate toward the circuit board.

8. The contact switch according to claim 5, wherein the resistive element is formed from a conductive material containing carbon powder.

9. The contact switch according to claim 5, wherein the electrode arranged on the second substrate and the resistive element are formed from the same type of conductive material.

10. The contact switch according to claim 5, wherein the electrode arranged on the first substrate includes comb-shaped teeth.

11. A method for manufacturing a membrane switch including a first substrate and a second substrate arranged to face each other, and two electrodes respectively arranged on the first and second substrates in a manner that the electrodes face each other, wherein at least one of the electrodes is movable between a position at which the one of the electrodes comes in contact with the other one of the electrodes and a position at which the at least one of the electrodes is spaced from the other one of the electrodes, the method comprising:
    applying and drying a conductive material on the first substrate to form an electric circuit having a plurality of resistive elements on the first substrate by applying the conductive material in the same direction to form each resistive element; and
    applying and drying a resist material on the first substrate to form a resist film for protecting the electric circuit on the first substrate and to form in the resist film an opening through which each resistive element is exposed.

12. The method according to claim 11, wherein the electric circuit is formed by performing screen printing.

13. The method according to claim 12, wherein the electric circuit includes wiring connecting the electrode of the first substrate and each resistive element, with the direction in which the conductive material is applied to the first substrate to form each resistive element being parallel with the wiring at locations where each resistive element is arranged.

14. The method according to claim 12, further comprising:
    forming the electrode on the second substrate by screen printing the electrode on the second substrate with a conductive material using a screen printing plate, wherein each resistive element of the electric circuit and the electrode formed on the second substrate are formed using the same screen printing plate.

15. The manufacturing method according claim 11, wherein the electric circuit is formed using an inkjet printing machine.

* * * * *